United States Patent
Park et al.

(10) Patent No.: US 6,639,036 B2
(45) Date of Patent: Oct. 28, 2003

(54) ACID-LABILE POLYMER AND RESIST COMPOSITION

(75) Inventors: JooHyeon Park, Chonan (KR); DongChul Seo, Chonan (KR); YoungTaek Lim, Chonan (KR); HyunSang Joo, Chonan (KR); SeongDuk Cho, Chonan (KR); SeongJu Kim, Taejeon (KR)

(73) Assignee: Korea Kumho Petrochemical Co. Ltd., Seoul (KR)

( * ) Notice: Subject to any disclaimer, the term of this patent is extended or adjusted under 35 U.S.C. 154(b) by 0 days.

(21) Appl. No.: 10/056,124

(22) Filed: Jan. 24, 2002

(65) Prior Publication Data

US 2002/0156216 A1 Oct. 24, 2002

(30) Foreign Application Priority Data

Apr. 23, 2001 (KR) ........................ 2001-21687

(51) Int. Cl.$^7$ .............................. C08F 10/00
(52) U.S. Cl. .................. 526/284; 526/266; 526/271; 526/281; 526/318.4; 526/320; 526/332; 526/347; 430/270.1
(58) Field of Search ............... 526/266, 271, 526/281, 284, 318.4, 320, 332, 347; 430/270.1

(56) References Cited

U.S. PATENT DOCUMENTS 6,380,339 B1 * 4/2002 Fang et al. .................. 526/279
6,387,589 B1 * 5/2002 Koh et al. ................ 430/270.1
6,399,274 B1 * 6/2002 Kinsho et al. ........... 430/270.1

OTHER PUBLICATIONS

Robert D. Allen, et al, "Protecting Groups for 193–nm Photoresists", SPIE vol. 2724, pp. 334–343. (No month day).

Thomas I. Wallow, et al., "Evaluation of Cycloolefin–Maleic Anhydride Alternating Copolymers as Single–Layer Photoresists for 193nm Photolithography", SPIE vol. 2724, pp. 355–364. (No month day).

* cited by examiner

Primary Examiner—Helen L. Pezzuto
(74) Attorney, Agent, or Firm—Davidson, Davidson, & Kappel, LLC

(57) ABSTRACT

A chemically amplified resist composition consists of an acid generating agent, additive, solvent and a copolymer represented by the following formula:

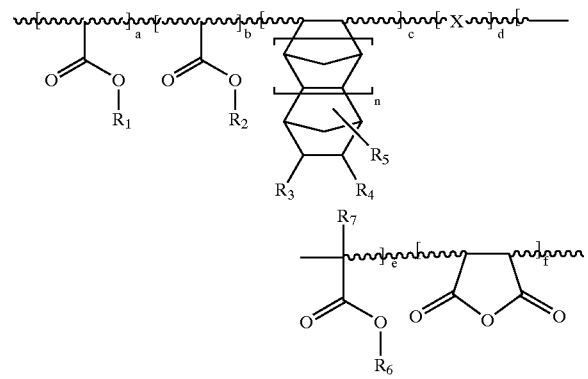

where $R_1$, $R_2$ and $R_6$ are independent of each other and respectively include a hydrogen atom or an alkyl, alkoxymethylene, alkoxyethylene, phenyl, alkoxyalkylene, alkylphenyl, alkoxyphenyl, allyl, benzyl, alkylbenzyl, alkoxybenzyl containing 1 to 34 carbon atoms having or not having an hydroxy, ether, ester, carbonyl, acetal, epoxy, nitrile or aldehyde; $R_5$ is a hydrogen atom, an alkyl or alkoxy group containing 1 to 18 carbon atoms; $R_7$ is a hydrogen atom, an alkyl group containing 1 to 18 carbon atoms, an alkyl group containing alkoxy 1 to 18 carbon atoms or an alkyl group containing ester of 1 to 18 carbon atoms; $R_3$ and $R_4$ are independent and respectively include a hydrogen atom, hydroxy, nitrile, aldehyde, hydroxymethylene, and alkylcarbonyloxy, alky, hydroxyalkylene, alkoxycarbonyl, alkoxymethylene or alkoxyalkanyl group containing 1 to 18 carbon atoms; X is olefin derivatives, vinyl ether derivatives or styrene derivatives containing 1 to 40 carbon atoms, alternatively these derivatives may be comprised of hydroxy, ester, alkoxyalkyloxycarbonyl, ketone or ether; a, b, c, d, e and f are a number represented a repeating unit in the main chain, wherein $a+b+c+d+e+f=1$, the content of a and b are 0 to 0.7, respectively, $(a+b)/(a+b+c+d+e+f) > 0.3$, and the content of c, d, e and f are 0 to 0.9, respectively; and n is an integer of 0 or 1.

9 Claims, No Drawings

ACID-LABILE POLYMER AND RESIST COMPOSITION

BACKGROUND OF THE INVENTION

1. The Field of the Invention

This invention relates to a novel acid-labile polymer and a resist composition containing the same, and more particularly to a novel polymer useful for preparation of photoresist for fine works using various radiations, for examples, a charged particle rays such as electron beam (e-beam), X-rays such as synchrotron radiation and far infrared radiation such as KrF excimer laser or ArF excimer laser.

2. Related Prior Art

Recently, with an increase in the large-scale integration (LSI) of semiconductor devices, there is a demand for super-fine patterns of which the size is 0.13 $\mu$m or smaller in manufacturing very large scale integration (VLSI). Accordingly, the radiations utilized as a conventional exposure source, such as g- or i-ray, have become replaced with those that have a shorter wavelength, and lithographic techniques using far ultraviolet rays (e.g., KrF or ArF excimer laser), X-ray or electron beam have lately attracted considerable attention. Especially, an ArF excimer laser is a most promising exposure source in the future lithography requiring a pattern size of 0.13 $\mu$m or smaller.

A resist composition suitable for fine works using such radiations is composed of a component having an acid-liable functional group (hereinafter referred to as "polymer"), a component generating an acid upon light radiation (hereinafter referred to as "photoacid generator"), and a solvent. Such a resist composition may additionally comprise a dissolution inhibitor or a base additive.

On the other hand, the polymer used as a principal component of the resist composition should have a low absorbance in the wavelength range of the exposure source.

The chemically amplified resist used in the conventional radiation of a KrF excimer laser is usually composed of a phenol-based polymer as a principal component, with a disadvantage in that the polymer shows a high absorbance in the range of the ArF excimer laser region due to aromatic rings included therein. Such a high absorbance in the wavelength range may deteriorate the perpendicularity and, hence, the resolution of the resulting photoresist pattern.

In order to solve the aforementioned problem, many studies have been made on resins destitute of unsaturated hydrocarbon or aromatic group as a polymer suitable for use in a photoresist composition sensitive to an ArF excimer laser. Examples of such polymers that exhibit a relatively low absorbance in the wavelength range of the ArF excimer laser may include acrylate polymer, olefin polymer and maleic anhydride-cycloolefin polymer.

Such polymers as disclosed in the prior documents include an acrylate polymer containing an alicyclic group (See. SPIE (1996, 2724, 334)) and a maleic anhydride-cycloolefin polymer (See. SPIE (1996, 2724, 355)). The acrylate polymer had a low optical absorbance in the wavelength range of the ArF excimer laser but shows a poor etching resistance. The maleic anhydride-cycloolefin polymer is superior in etching resistance to the acrylate polymer but has a high optical absorbance in the wavelength range of the ArF excimer laser, resulting in poor perpendicularity of the photoresist pattern. Furthermore, the maleic anhydride monomer is liable to hydrolysis, and formulation of a resist composition comprising the maleic anhydride monomer has low storage stability.

SUMMARY OF THE INVENTION

In order to overcome the problem as such, many studies have been conducted to minimize variations in property through hydrolysis of anhydride group in the storage, that is, by minimizing the content of a maleic anhydride monomer or by not adding a maleic anhydride monomer. As a result, it generated an alicyclic group in the polymer main chain having a high etching resistance and maleic derivatives or fumaric derivatives similar to an acrylate monomer, which generated in the polymer main chain, thereby making an increase in etching resistance by protecting of main chain when it was dry-etched.

It is therefore an object of the present invention to provide a polymer that can be used to prepare a resist pattern having high sensitivity, resolution, developability, dry-etching resistance, transparency at the excimer laser wavelength, good adhesion and low dependency upon the substrate.

It is another object of the present invention to provide a chemically amplified resist composition having the above-mentioned polymer to be induced by far infrared beam such as a KrF excimer laser or a ArF excimer laser.

In order to achieve the aforementioned objects of the present invention, there is provided a multi-cyclic polymer represented by the following formula 1.

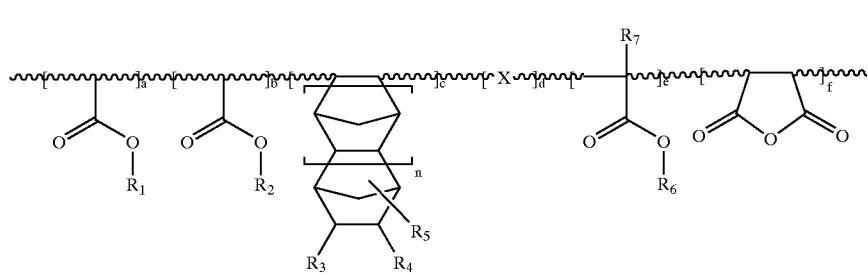

Formula I

At this time, $R_1$, $R_2$ and $R_6$ are independent of one another and include a hydrogen atom or an alkyl, alkoxymethylene, alkoxyethylene, phenyl, alkoxyalkylene, alkylphenyl, alkoxyphenyl, allyl, benzyl, alkylbenzyl, alkoxybenzyl containing 1 to 34 carbon atoms with or without an hydroxy, ether, ester, carbonyl, acetal, epoxy, nitrile or aldehyde; $R_5$ is a hydrogen atom, an alkyl or alkoxy group containing 1 to 18 carbon atoms; $R_7$ is a hydrogen atom, an alkyl group containing 1 to 18 carbon atoms, an alkyl group containing alkoxy 1 to 18 carbon atoms or an alkyl group containing ester of 1 to 18 carbon atoms; $R_3$ and $R_4$ are independent and include a hydrogen atom, hydroxy, nitrile, aldehyde, hydroxymethylene, and alkylcarbonyloxy, alkyl, hydroxyalkylene, alkoxycarbonyl, alkoxymethylene or alkoxyalkanyl group containing 1 to 18 carbon atoms; X is olefin derivatives, vinyl ether derivatives or styrene derivatives containing 1 to 40 carbon atoms, alternatively these derivatives may include hydroxy, ester, alkoxyalkyloxycarbonyl, ketone or ether; a, b, c, d, e and f are a number representing a repeating unit in the main chain, wherein, if a+b+c+d+e+f=1, the content of a and b is 0 to 0.7, respectively, and, if (a+b)/(a+b+c+d+e+f)>0.3, the content of c, d, e and f is 0 to 0.9, respectively (where, n is an integer of 0 or 1).

Furthermore, a resist composition of the present invention consists of multi-cyclic polymer, as represented by the above formula 1, containing acid generating agent, additive and solvent.

DETAILED DESCRIPTION OF THE INVENTION

Now, the present invention will be described in further detail as set forth hereunder.

The former acrylate polymer has a low glass transition temperature ($T_g$) and low etching resistance, so that it has not been utilized in the field of semiconductor device process. Maleic anhydride cycloolefin polymer has not been applied to semiconductor device processes, due to a reduction in perpendicularity and a low resolution of a pattern when absorption increases.

To overcome the above-mentioned problems, the resin composition of the present invention has a high $T_g$ and high etching resistance owing to an olefin monomer containing a cycloolefin in the main chain or an alicyclic group in the side chain. Also, etching resistance increases with the side chain generating from alicyclic group, which has acid-labile group to act as a high etching resistance.

The resin composition of the present invention comprises an olefin monomer containing cycloolefin in the main chain or an alicyclic group in the side chain or a polymer having a repeating unit of maleic acid derivatives or fumaric acid derivatives and a resist composition containing a polymer.

Now, the polymer and resist composition as such will be described in detail.

Polymer

A polymer to be used in the present invention is an olefin monomer, maleic acid derivatives or fumaric acid derivatives containing a cycloolefine in the main chain or an alicyclic group in the side chain as a repeating unit.

Alternatively, the polymer can be synthesized by adding acrylate, vinyl ether and styrene derivatives. The polymer to be synthesized in the present invention is insoluble or non-soluble in an alkaline solution in itself. However, it can also be soluble in the alkaline solution. Even if the polymer usually has an acid-labile group in the side chain, it may not have the acid-labile group all the time.

The solubility of the polymer to the alkaline solution depends on the content of the acid-labile group decomposed by acid. The solubility decreases with an increase in the content of the acid-labile. As a monomer type and its content in the polymer are varied, there may be a decrease or increase in solubility. Generally, as the number of hydrophobic groups increases, its solubility to the alkaline solution decreases. The substrate using the polymer obtained by controlling a repeating unit type and its content has good adhesion, non-dependency, sensitivity and resolution.

The polymer of the present invention is a multi-cyclic polymer represented by above-mentioned formula 1.

As shown in formula 1, a and b have to be adjacent each other and their content is preferably greater than 30% to the total monomer contents. If the content of a and b is less than 30%, developability to develop a solution after exposure decreases.

Preferably, the amount of alicyclic group in the main chain or side chain of the polymer should be at least 5%. If the amount of the alicyclic group is less than 5% in content, its etching resistance of the resist reduces.

The polymer represented by formula 1 is a resin containing more than 2 derivatives for each repeating unit of a, b, c, d, e and f in a monomer. For example, the monomer represented by repeating unit c in formula 1 contains its derivatives c', c" and c''' as shown below in formula 2:

Formula 2

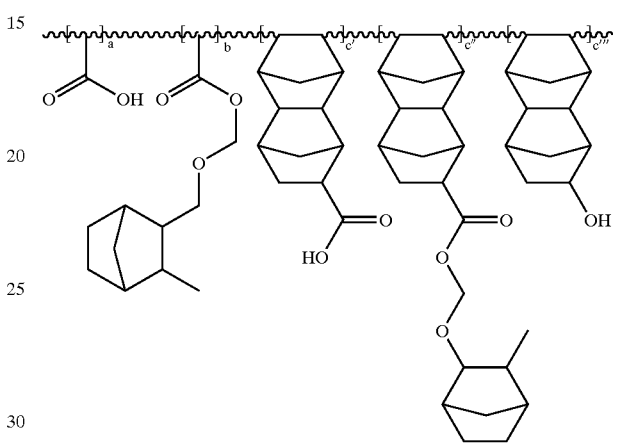

where a and b of the repeating unit are defined identical to those in formula 1, and c'+c"+c''' is the same as c in formula 1.

The multi-cyclic copolymer includes block, random and graft copolymers.

Synthesis of the polymer represented by formula 1 can be made by a common method. Preferably, it may be made by radical polymerization. At this time, the radical polymerization can be initiated by some initiators, such as azo-bis isobutyronitrile(AIBN), benzoyl peroxide(BPO), lauryl peroxide, azobisisocapronitrile, azobisisoballeronitrile and t-butyl hydroperoxide.

Polymerization methods are available, for example, bulk polymerization, solution polymerization, suspension polymerization, bulk-suspension polymerization or emulsion polymerization. Polymerization solvent may be selected among benzene, toluene, xylene, halogenated benzene, diethylether, tetrahydrofurane(THF), ester class, ether class, lactone class, ketone class and amide class.

Another method to obtain the polymer represented by formula 1, maleic anhydride radically polymerized with at least one derivative selected among the cycloolefin derivative, olefin derivative, styrene deriviative, acrylate derivtive and vinyl ether derivative. After generation of a carboxylic acid group through hydrolysis or alcoholysis reaction, the group is esterificated totally or partially.

Polymerization temperature is controlled with a type of a catalyst and a molecular weight distribution of the polymer with various amounts of an initiator and reaction time. After completion of the reaction, it is preferable that those un-reacted monomer and side products remained in the reaction mixture should be eliminated by precipitation.

Average molecular weight ($M_w$) of the polymer, as represented by formula 1, is measured by gel permeation chromatography(GPC) to be generally 2,000 to 1,000,000, preferably, 3,000 to 50,000 in consideration of sensitivity, developability, coatability and thermal stability as a photoresist. The molecular weight distribution of the polymer may be 1.0 to 5.0, more preferably, 1.0 to 2.0.

Detailed reaction example of the polymer represented by formula 1 will be described below. However, the present invention should not be limited to the following examples.

REACTION EXAMPLE 1

Copolymer of Maleic Acid and Cycloolefin Derivatives

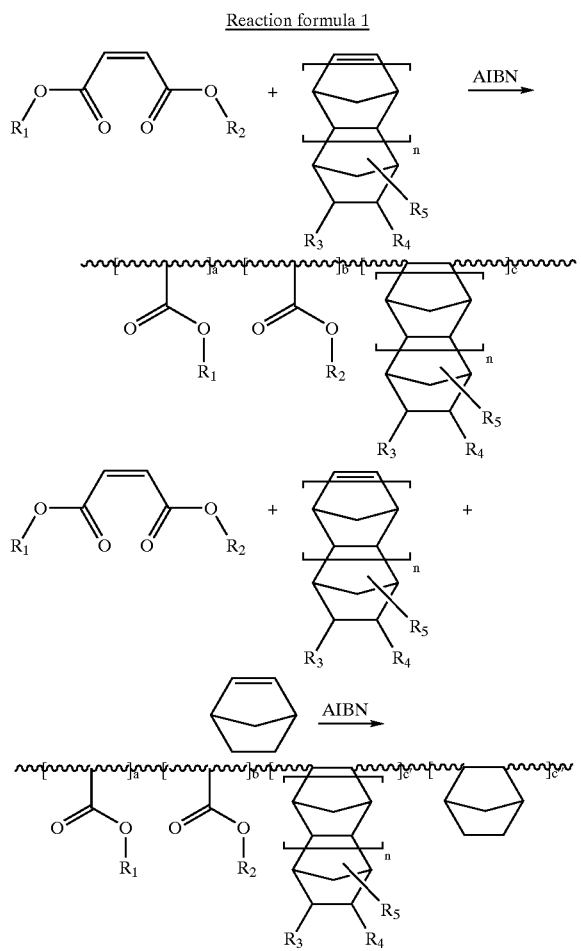

where c'+c" is identical to c in formula 1.

REACTION EXAMPLE 2

Copolymer of Maleic Acid, Cycloolefin and Olefin Derivatives

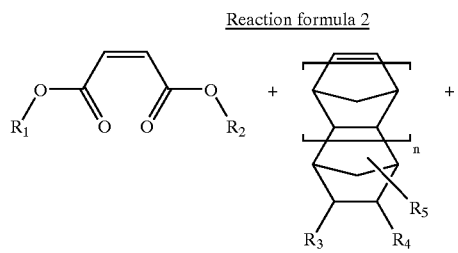

REACTION EXAMPLE 3

Copolymer of Maleic Acid, Cycloolefin and Styrene Derivatives

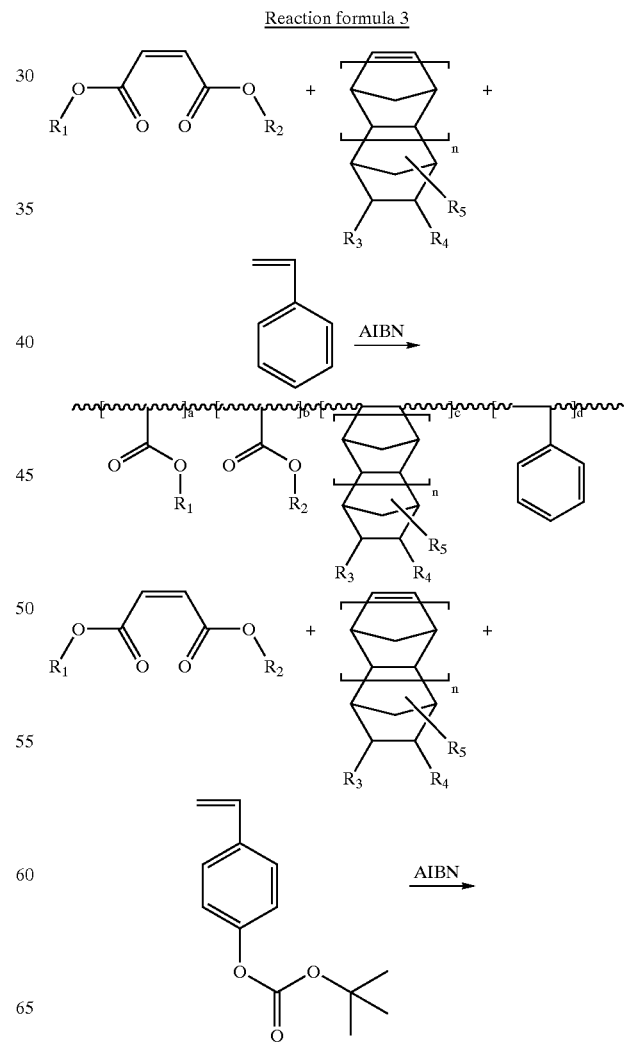

-continued
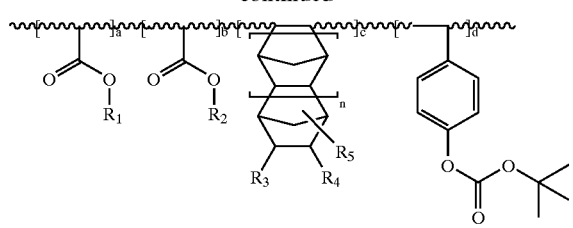
REACTION EXAMPLE 4
Copolymer of Maleic Acid, Cycloolefin and Vinyl Ether Derivatives
Reaction formula 4
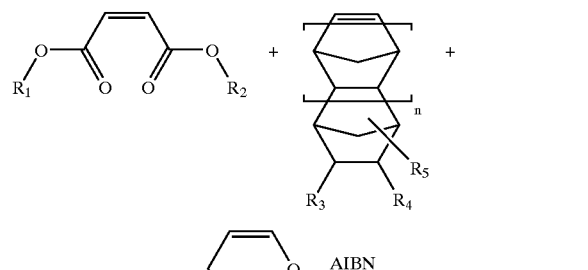
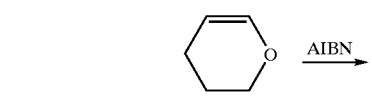
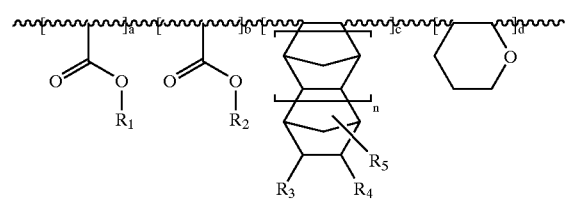
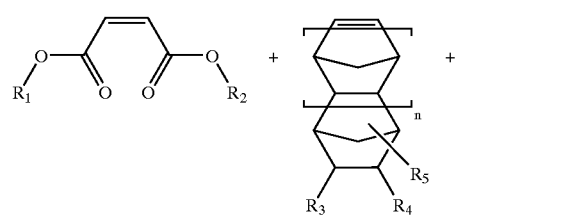
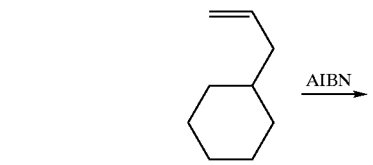
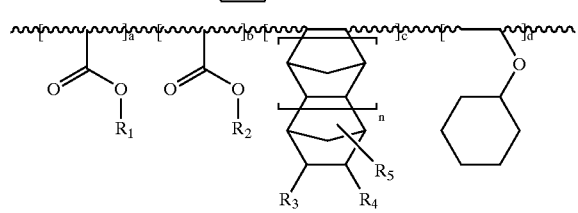
REACTION EXAMPLE 5
Copolymer of Maleic Acid, Cycloolefin and Acrylate Derivatives
Reaction formula 5
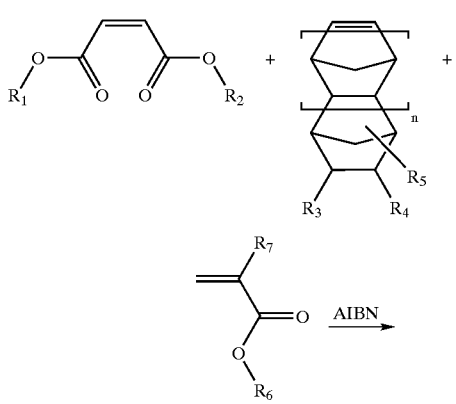
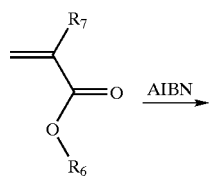
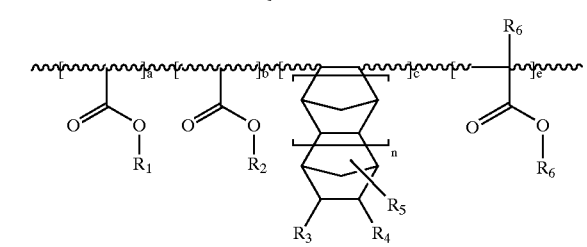
REACTION EXAMPLE 6
Copolymer of Maleic Acid, Cycloolefin and Maleic Anhydride Derivatives
Reaction formula 6
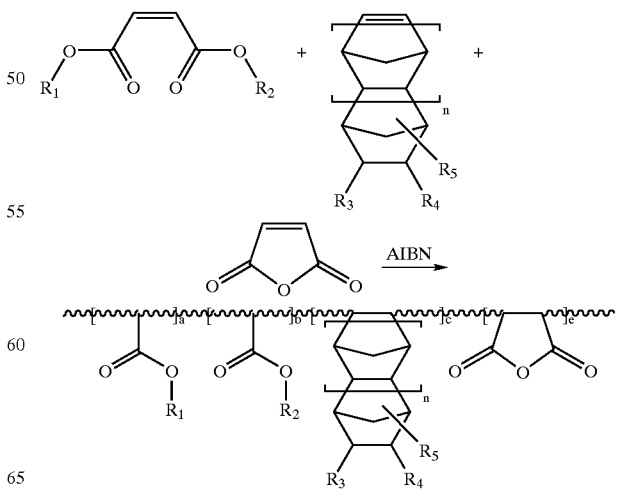

REACTION EXAMPLE 7

Hydrolysis of Maleic Anhydride and Norbornene Copolymer and Functionalization of Carboxylic Acid Reaction formula 7

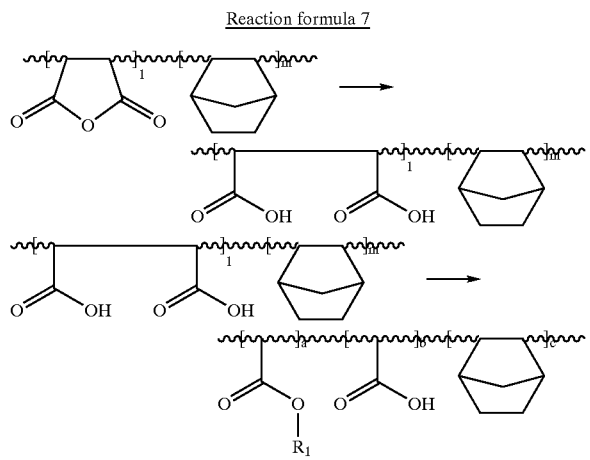

where l and m represent a repeating unit of copolymer, and the content of l and m is 0.3 to 0.6. At this time, l+m is 1, and a, b, c and $R_1$ may be defined the same as those in formula 1.

In other words, the first reaction, hydrolysis is performed with maleic anhydride and norbornene copolymer dissolved in the mixture of water and solvent and, then, obtained in the presence of an acid or base catalyst. The acid catalyst is commonly available. For example, sulfuric acid, hydrochloric acid, nitric acid, phosphoric acid, and toluenesulfonic acid may be preferred.

In case of the base catalyst, the polymer obtained with maleic anhydride and norbornene copolymer is dissolved in a solvent or prepared to a suspension phase, and then a base catalyst precipitates the mixture.

The base catalyst is available in either amine class or metal class. For example, the base catalyst may be an amine class catalyst of t-amines such as DBU, triethylamine and pyridine as well as a metal class catalyst like potassium hydroxide, potassium carbonate, sodium hydroxide and sodium carbonate.

When the base catalyst is used for the reaction, it should be neutralized with acid after completion of the reaction.

The secondary reaction is performed with a carboxylic acid group and acid-labile group or general group under an acid or base catalyst. The functional group using the base catalyst may be obtained in an interchange reaction of alkyl halogen compound, allyl halogen compound, benzyl derivative and alkoxyalkanyl halide derivative. In case of the acid catalyst, the functional group obtained by vinyl ether derivative, 3rd olefin derivative and epoxy derivative. This reaction may be also performed totally, partially or alternatively.

Meanwhile, the polymer represented by reaction formula 1 is prepared through an alcoholysis reaction as follows. However, the present invention should not be limited to the following example.

REACTION EXAMPLE 8

Alcoholysis of Maleic Anhydride and Norbornene Copolymer and Functionalized Reaction of Carboxylic Acid Reaction formula 8

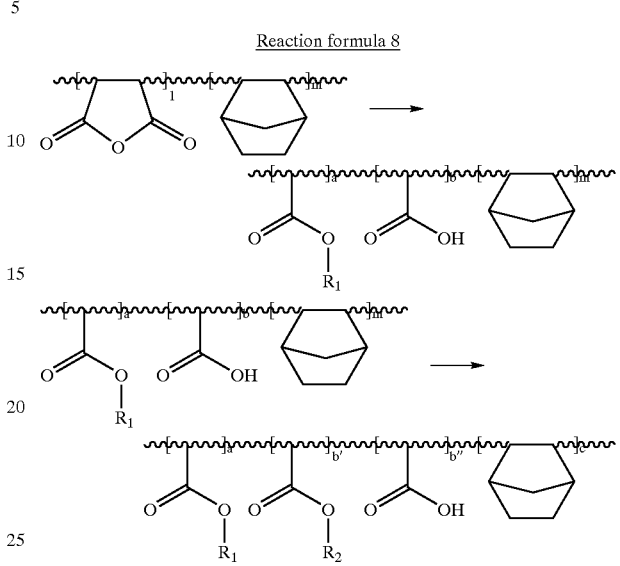

where l and m represent a repeating unit of the copolymer, and the amount of l and m is 0.3 to 0.3. At this time, l+m=1; a, c, $R_1$ and $R_2$ are defined the same as those in formula 1; and b'+b" is identical to b in formula 2.

In other words, the first reaction, alcoholysis is performed with maleic anhydride and norbornene copolymer dissolved in solvent, alcohol or the mixture thereof, and, then, with an acid or base catalyst.

Now, synthesis of the polymer represented by formula 1 through hydrolysis will be described below. But the present invention should not be limited to the following examples.

An acid catalyst is commonly available, preferably, with a strong acid such as sulfuric acid, hydrochloric acid, nitric acid, phosphoric acid or toluenesulfonic acid.

In case of a base catalyst, either amine class or metal class catalyst is available. The base catalyst may be an amine class catalyst of t-amines such as DBU, triethylamine and pyridine as well as a metal class catalyst like potassium hydroxide, potassium carbonate, sodium hydroxide and sodium carbonate.

When the base catalyst is used for reaction, it should be neutralized with acid after completion of the reaction. The reaction may also be performed totally, partially or alternatively.

The secondary reaction is performed with a carboxylic acid group, an acid-labile group or a similar group under the acid or base catalyst. The functional group using the base catalyst is obtained in an interchange reaction of alkyl halogen compound, allyl halogen compound, benzyl derivative and alkoxyalkanyl halide derivative. In case of the acid catalyst, a functional group is obtained with vinyl ether derivative, 3rd olefin derivative and epoxy derivative. This reaction may be also performed totally, partially or alternatively.

Meanwhile, the polymer includes a resist or a mixture of at least one resist.

Synthesis of a resin in the present invention may be described in detail with the following reaction formula. However, the present invention should not be limited to the following example.

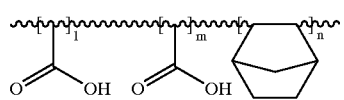
Formula 3 where l, m and n represent a repeating unit of polymer, the content of the l, m and n is respectively 0.1 to 0.75. At this time, l+m+n=1.

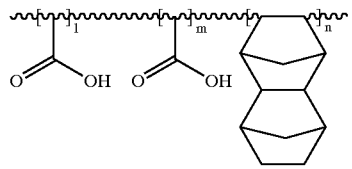
Formula 4 where l, m and n represent a repeating unit of polymer, the content of the l, m and n is respectively 0.1 to 75. At this time, l+m+n=1.

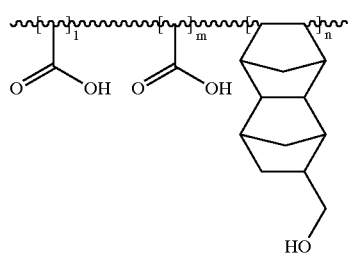
Formula 5 where l, m and n represent a repeating unit of polymer, the content of l, m and n is respectively 0.1 to 0.75. At this time, l+m+n=1.

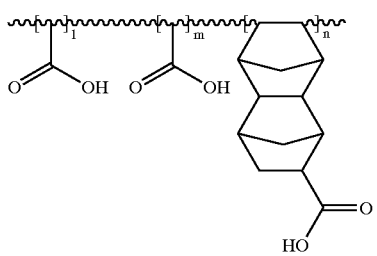
Formula 6 where l, m and n represent a repeating unit of polymer, the content of l, m and n is respectively 0.1 to 0.75. At this time, l+m+n=1.

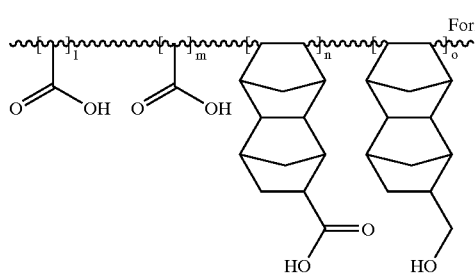
Formula 7 where l, m and n represent a repeating unit of polymer; the content of l and m is respectively 0.1 to 0.75; n and 0 are respectively 0.1 to 0.75. At this time, l+m+n=1.

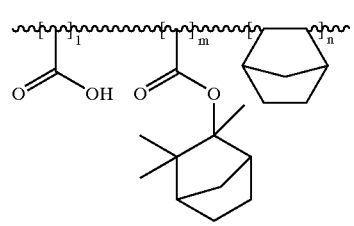
Formula 8 where l, m and n represent a repeating unit of polymer, the content of l and m is respectively 0 to 0.7 and the content of n is 0.3 to 0.6. At this time, l+m+n=1.

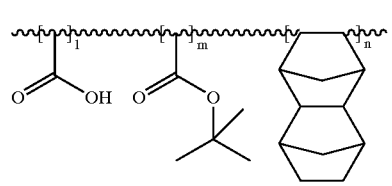
Formula 9 where l, m and n represent a repeating unit of polymer, the content of l and m is respectively 0 to 0.7, and the content of n is 0.3 to 0.6. At this time, l+m+n=1.

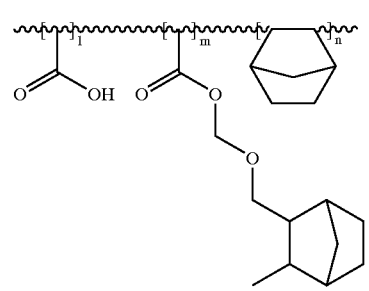
Formula 10 where l, m and n represent a repeating unit of polymer, the content of l and m is respectively 0 to 0.7, and the content of n is 0.3 to 0.6. At this time, l+m+n=1.

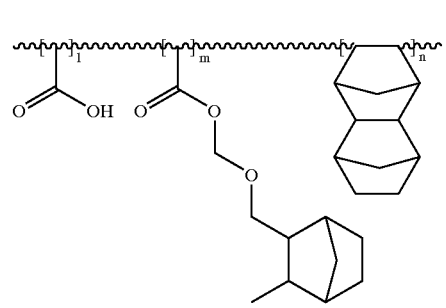
Formula 11 where l, m and n represent a repeating unit of polymer, the content of l and m is respectively 0 to 0.7 and the content of n is 0.3 to 0.6. At this time, l+m+n=1.

Formula 12

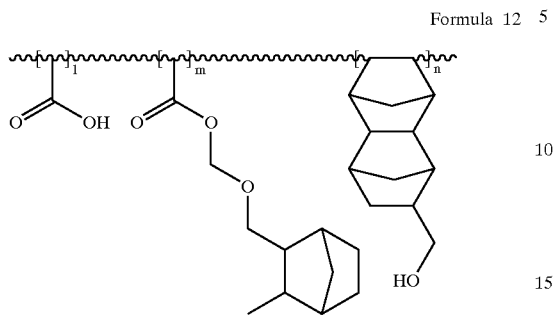

where l, m and n represent a repeating unit of polymer, the content of l and m is respectively 0 to 0.7, and the content of n is 0.3 to 0.6. At this time, l+m+n=1.

Formula 13

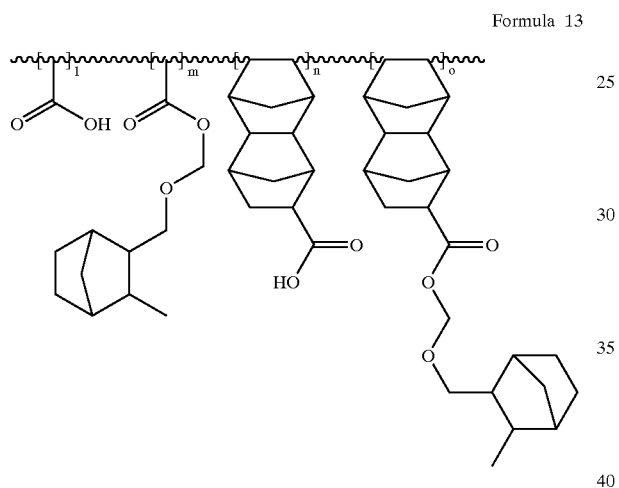

where l, m and n represent a repeating unit of polymer, the content of l and m is respectively 0 to 0.7; and the content of n and o is respectively 0.3 to 0.6. At this time, l+m+n+o=1.

Formula 14

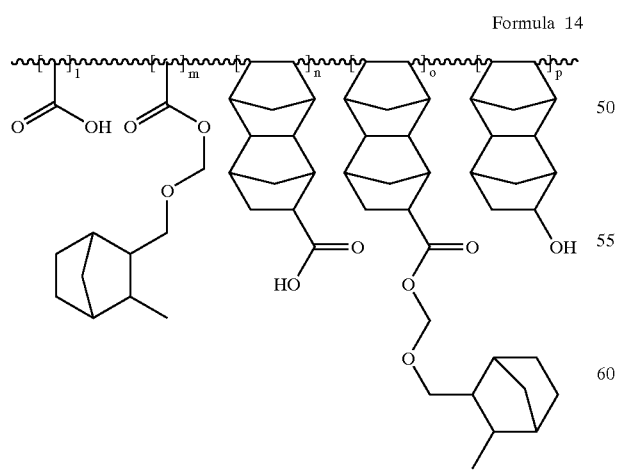

where l, m, n, o and p represent a repeating unit of polymer, the content of l and m is respectively 0 to 0.7, and the content of n, o and p are respectively 0 to 0.6. At this time, l+m+n+o+p=1.

Formula 15

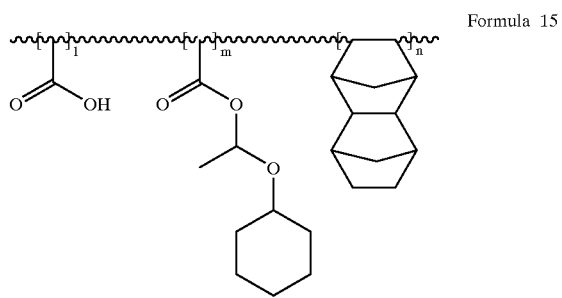

where l, m and n represent a repeating unit of polymer, the content of l and m is resepctively 0 to 0.7, and the content of n is 0.3 to 0.6. At this time, l+m+n=1.

Formula 16

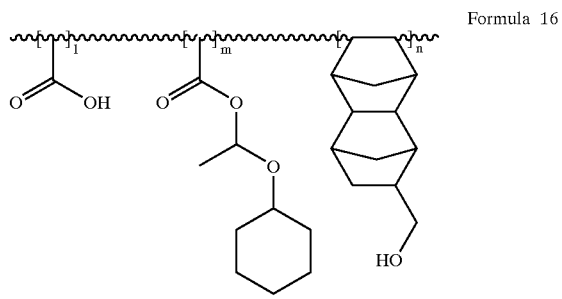

where l, m and n represent a repeating unit of polymer, the content of l and m is respectively 0 to 0.7 and the content of n is 0.3 to 0.6. At this time, l+m+n=1.

Formula 17

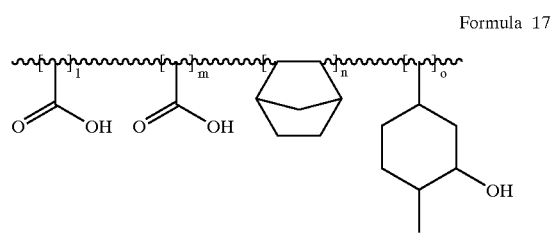

where l, m, n and o represent a repeating unit of polymer; the content of l and m is respectively 0.1 to 0.75; and the content of n and o is respectively 0 to 0.6. At this time, l+m+n+o=1.

Formula 18

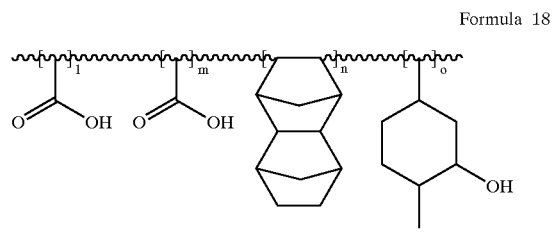

where l, m, n and o represent a repeating unit of polymer, the content of l and m is respectively 0.1 to 0.75, and the content of n and o is respectively 0 to 0.6. At this time, l+m+n+o=1.

Formula 19

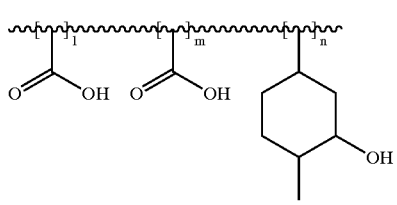

where l, m and n represent a repeating unit of polymer, the content of l, m and n is respectively 0.1 to 0.75. At this time, l+m+n=1.

Formula 20

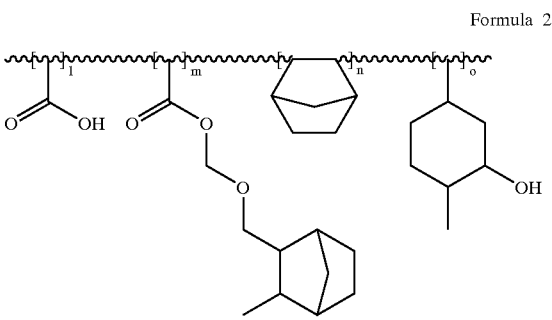

where l, m, n and o represent a repeating unit of polymer; the content of the l and m is respectively 0.1 to 0.7, and the content of n and o is respectively 0 to 0.6. At this time, l+m+n+o=1.

Formula 21

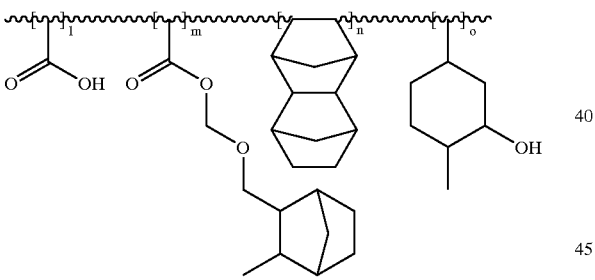

where l, m, n and o represent a repeating unit of polymer; the content of the l and m is respectively 0 to 0.7; and the content of n and o is respectively 0 to 0.6. At this time, l+m+n+o=1.

Formula 22

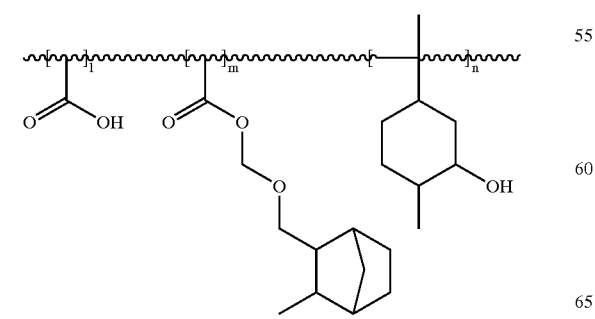

where l, m and n represent a repeating unit of polymer; the content of l and m is respectively 0 to 0.7; and the content of n is 0 to 0.6. At this time, l+m+n=1.

Formula 23

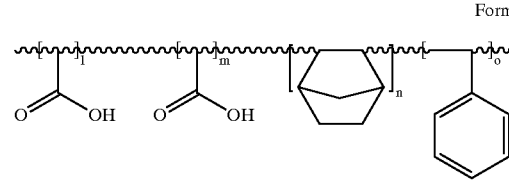

where l, m, n and o represent a repeating unit of polymer; the content of l and m is respectively 0.1 to 0.75; and the content of n and o is respectively 0 to 0.6. At this time, l+m+n+o=1.

Formula 24

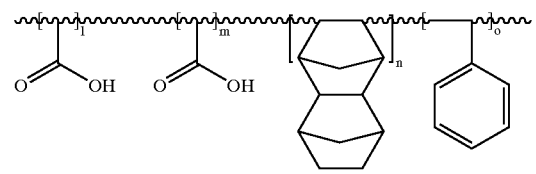

where l, m, n and o represent a repeating unit of polymer; the content of l and m is respectively 0.1 to 0.75; and the content of n and o is respectively 0 to 0.6. At this time, l+m+n+o=1.

Formula 25

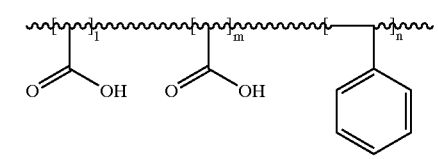

where l, m and n represent a repeating unit of polymer; the content of l, m and n is respectively 0.25 to 0.75. At this time, l+m+n=1.

Formula 26

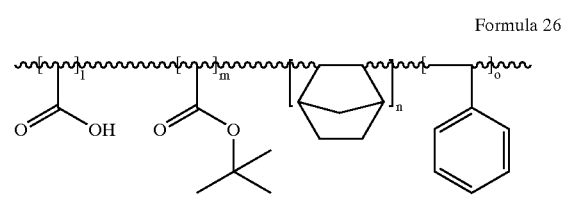

where l, m, n and o represent a repeating unit of polymer; the content of l and m is respectively 0 to 0.7; and the content of n and o is respectively 0 to 0.6. At this time, l+m+n+o=1.

Formula 27

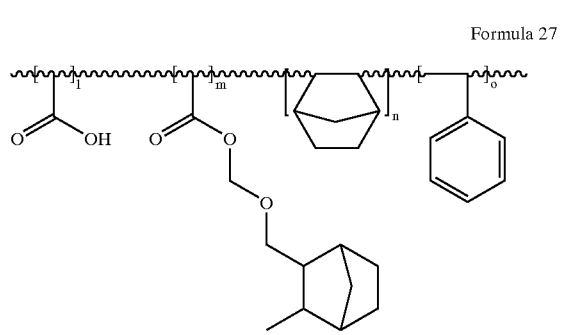

where l, m, n and o represent a repeating unit of polymer; the content of l and m is respectively 0 to 0.7; and the content of n and o is respectively 0 to 0.6. At this time, l+m+n+o=1.

Formula 28

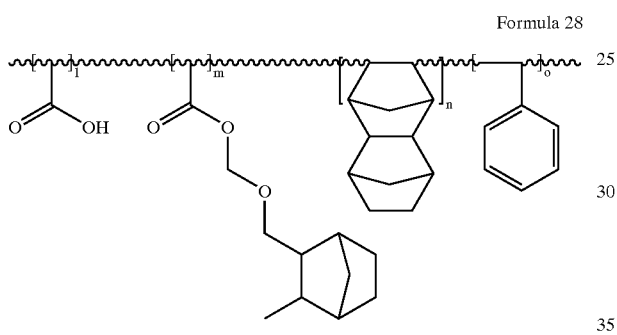

where l, m, n and o represent a repeating unit of polymer; the content of l and m is respectively 0 to 0.7; and the content of n and o is respectively 0 to 0.6. At this time, l+m+n+o=1.

Formula 29

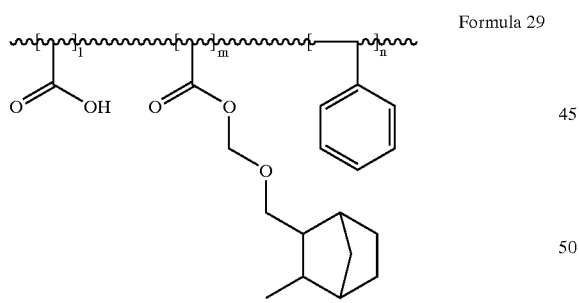

where l, m and n represent a repeating unit of polymer; the content of l and m is respectively 0 to 0.7; and the content of n and o is respectively 0 to 0.6. At this time, l+m+n+o=1.

Formula 30

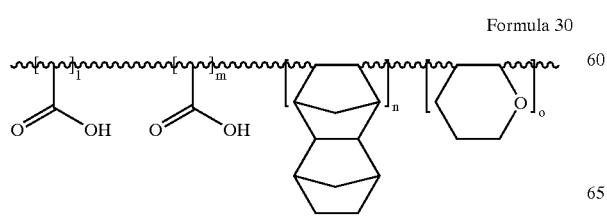

where l, m, n and o represent a repeating unit of polymer; the content of l and m is respectively 0.1 to 0.75; and the content of n and o is respectively 0 to 0.6. At this time, l+m+n+o=1.

Formula 31 where l, m, n and o represent a repeating unit of polymer; the content of l and m is respectively 0.1 to 0.75; and the content of n and o is respectively 0 to 0.6. At this time, l+m+n+o=1.

Formula 32

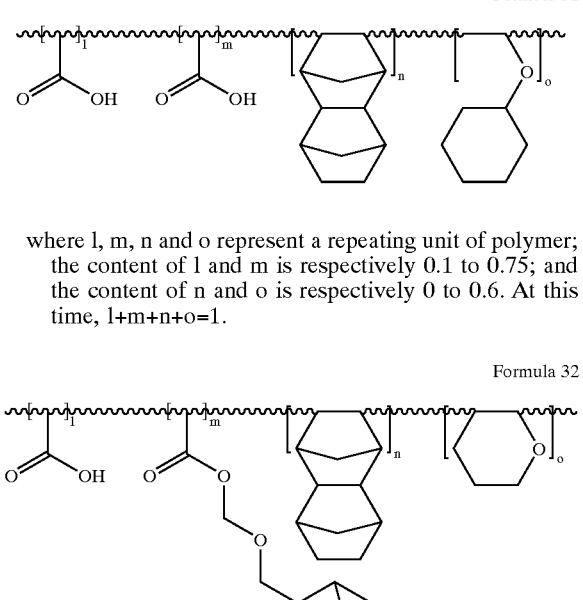

where l, m, n and o represent a repeating unit of polymer; the content of l and m is respectively 0 to 0.7; and the content of n and o is respectively 0 to 0.6. At this time, l+m+n+o=1.

Formula 33 where l, m, n and o represent a repeating unit of polymer; the content of l and m is respectively 0 to 0.7; and the content of n and o is respectively 0 to 0.6. At this time, l+m+n+o=1.

Formula 34

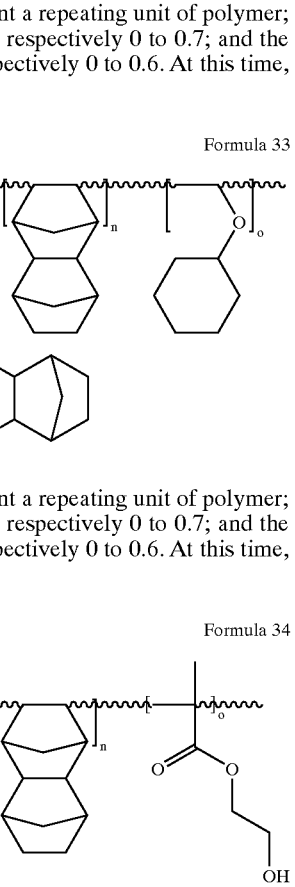

where l, m, n and o represent a repeating unit of polymer; the content of l and m is respectively 0.1 to 0.75; and the content of n and o is respectively 0 to 0.6. At this time, l+m+n+o=1.

Formula 35

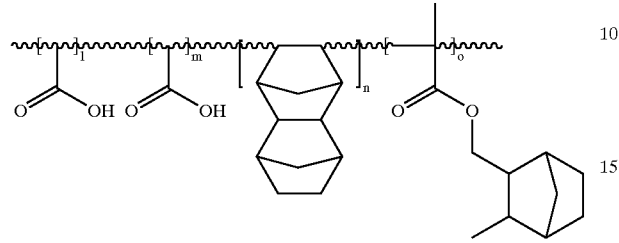

where l, m, n and o represent a repeating unit of polymer; the content of the l and m is respectively 0.1 to 0.75; and the content of n and o is respectively 0 to 0.6. At this time, l+m+n+o=1.

Formula 36

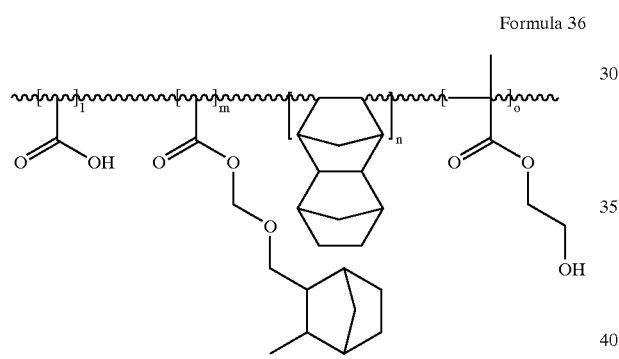

where l, m, n and o represent a repeating unit of polymer; the content of l and m is respectively 0 to 0.7; and the content of n and o is respectively 0 to 0.6. At this time, l+m+n+o=1.

Formula 37

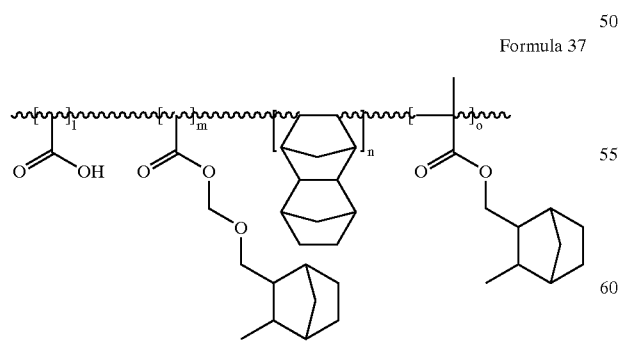

where l, m, n and o represent a repeating unit of polymer; the content of l and m is respectively 0 to 0.7; and the content of n and o is respectively 0 to 0.6. At this time, l+m+n=o=1.

Formula 38

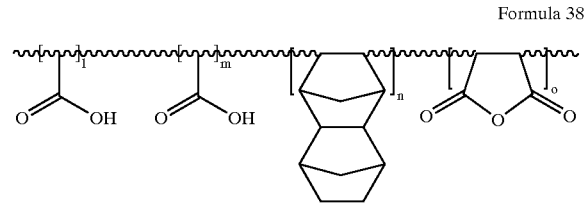

where l, m, n and o represent a repeating unit of polymer; the content of l and m is respectively 0.1 to 0.75; and the content of n and o is respectively 0 to 0.6. At this time, l+m+n+o=1.

Formula 39

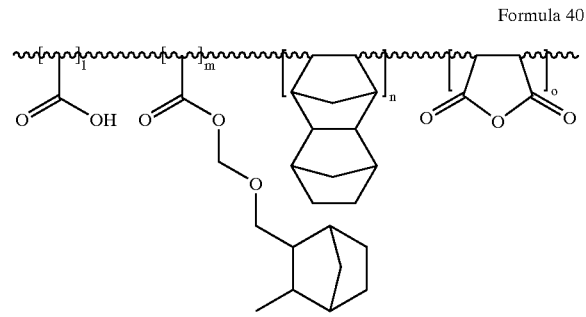

where l, m, n and o represent a repeating unit of polymer; the content of l and m is respectively 0.1 to 0.75; and the content of n and o is respectively 0 to 0.6. At this time, l+m+n+o=1.

Formula 40

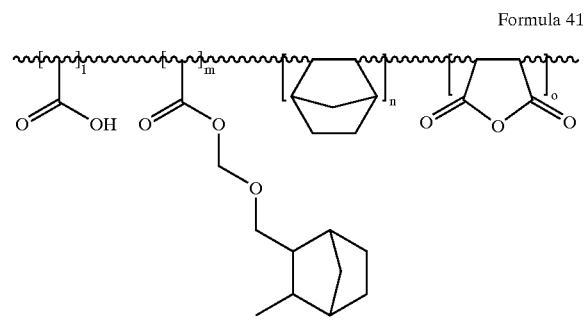

where l, m, n and o represent a repeating unit of polymer, the content of l and m is respectively 0 to 0.7; and the content of n and o is respectively 0 to 0.6. At this time, l+m+n+o=1.

Formula 41 where l, m, n and o represent a repeating unit of polymer; the content of l and m is respectively 0 to 0.7; and the content of n and o is respectively 0 to 0.6. At this time, l+m+n+o=1.

Formula 42

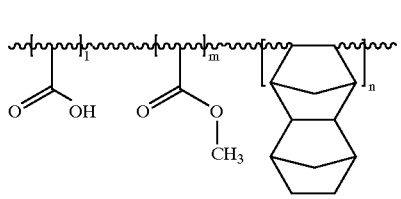

where l, m and n represent a repeating unit of polymer; the content of l, m and n is respectively 0.1 to 0.75. At this time, l+m+n=1.

Formula 43

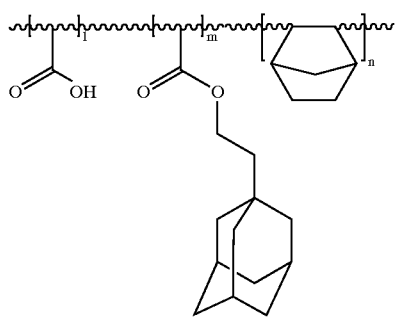

where l, m and n represent a repeating unit of polymer; and the content of l, m and n is respectively 0.1 to 0.75. At this time, l+m+n=1.

Formula 44

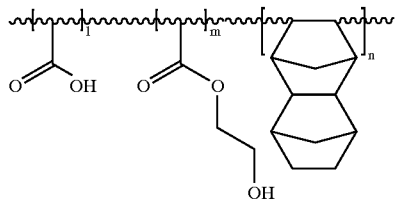

where l, m and n represent a repeating unit of polymer; and the content of l, m and n is respectively 0.1 to 0.75. At this time, l+m+n=1.

Formula 45

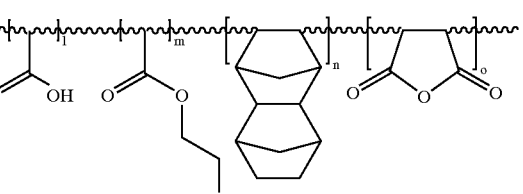

where l, m, n and o represent a repeating unit of polymer; the content of l and m is respectively 0.1 to 0.75; and the content of n and o is respectively 0 to 0.6. At this time, l+m+n+o=1.

Formula 46

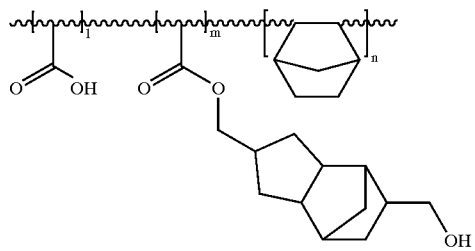

where l, m and n represent a repeating unit of polymer; and the content of l, m and n is respectively 0.1 to 0.75. At this time, l+m+n=1.

Formula 47

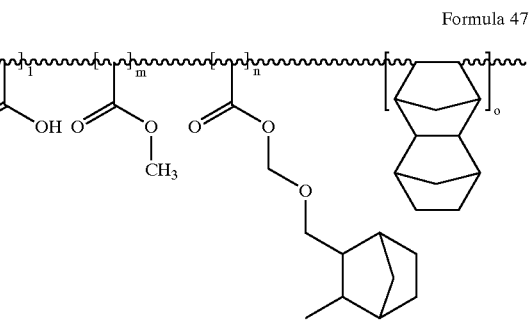

where l, m, n and o represent a repeating unit of polymer; and the content of l, m and n is respectively 0 to 0.7, and o is 0.25 to 0.6. At this time, l+m+n+o=1.

Formula 48

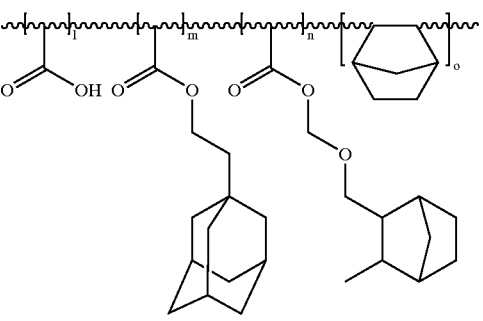

where l, m, n and o represent a repeating unit of polymer; the content of l, m and n is respectively 0 to 0.7; and the content of o is 0.25 to 0.6. At this time, l+m+n+o=1.

Formula 49

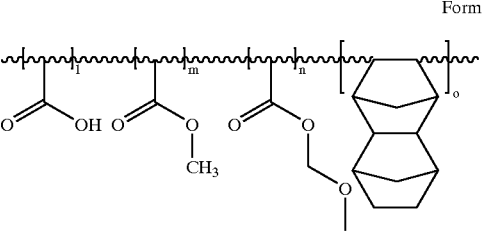

where l, m, n and o represent a repeating unit of polymer; the content of l, m and n is respectively 0 to 0.7; and the content of o is 0.25 to 0.6. At this time, l+m+n+o=1.

Formula 50

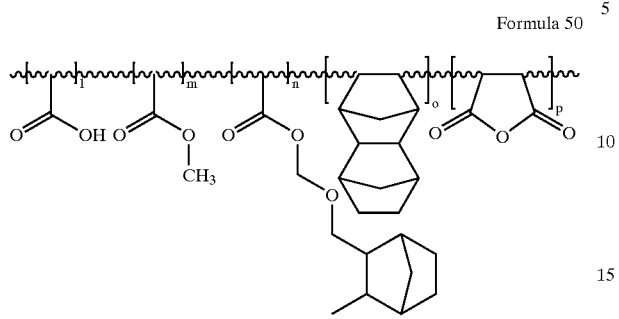

where l, m, n, o and p represent a repeating unit of polymer; the content of l, m and n is respectively 0 to 0.7; and the content of o and p is respectively 0.25 to 0.6. At this time, l+m+n+o+p=1.

Formula 51

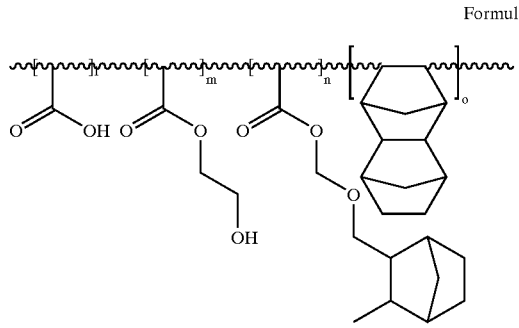

where l, m, n and o represent a repeating unit of polymer; the content of the l, m and n is respectively 0 to 0.7; and the content of o is 0.25 to 0.6. At this time, l+m+n+o=1.

Formula 52

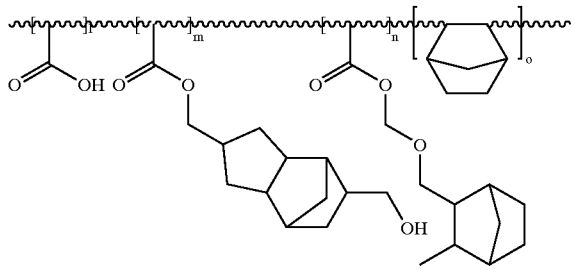

where l, m, n and o represent a repeating unit of polymer; the content of l, m and n is respectively 0 to 0.7; and the content of o is 0.25 to 0.6. At this time, l+m+n+o=1.

Acid-Generating Agent

The acid-generating agent of the present invention is selected from the group consisting of iodoium salt, sulfonium salt, phosphonium salt, diazonium salt, pyridium salt and amide group, more preferably, sulfonium salt represented by formulas 53 and 54.

Formula 53

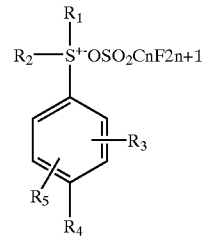

Formula 54

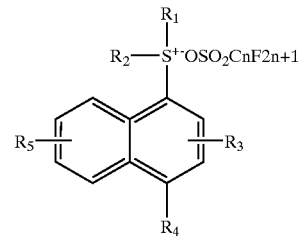

where, $R_1$ and $R_2$ are respectively alkyl, allyl, perpluoro alkyl, benzyl, aryl or halogen compounds substituted with aryl group; $R_3$, $R_4$ and $R_5$ are respectively hydrogen atom, alkyl group, halogen group, alkoxy group, aryl group, thiophenoxy group, thioalkoxy group or alkoxycarbonylmethoxy group; and n is a integer 1 to 8.

The above-mentioned acid-generating agent is 0.1 to 30 parts by weight per 100 parts by weight of the total solid content in the resist composition, preferably, 0.3 to 100 parts by weight. These acid-generating agents may be used alone or in combination as a mixture of two or more different kinds thereof.

Additives

For the resist composition of the present invention, alternatively, a compound accelerating dissolution to develop a solution, which will be degraded by acid, may also be utilized. The compound as such includes alicyclic derivatives such as t-butyl ester or alkoxyalkanyl ester. The content of the accelerating agent is 2 to 60 parts by weight per 100 parts by weight of the total solid content in the resist composition, preferably, 5 to 40 parts by weight.

Meanwhile, the resist composition of the present invention, if necessary, includes additives. Such additives are surfactant, halation inhibitor, adhesion assistant, storage stabilizer and antifoaming agent.

To prevent diffusion of acid generated after exposure, the resist composition of the present invention further includes a base compound. When the amount of the base compound increases, the sensitivity of the resist decreases. The content of the base compound is 0.01 part by weight to 5 parts by weight per 100 parts by weight of the total solid content.

To obtain a uniform and flat coating device of the resist composition, the resist composition is dissolved in a solvent with a proper evaporation rate and viscosity. Examples having the aforementioned properties include ethyleneglycol monomethyl ether, ethyleneglycol monoethyl ether, ethyleneglycol monoprophyl eyher, methylcellosolve acetate, ehylcellosolve acetate, prophyleneglycol monomethyl ether acetate, prophyleneglycol monoethyl ether acetate, prophyleneglycol monopropyl ether acetate, methyl isoprophyl ketone, cyclohexanone, methyl 2-hydroxypropionate, ethyl 2-hydoroxypropionate, 2-heptanone, ethyl lactate and r-butyrolactone, if necessary, the solvents as such may be used alone or in combination as a mixture of two or more different kinds thereof. The amount of the solvent to be used may be varied depending on its properties such as volatility, viscosity for the uniformity on the wafer.

To prepare the resist device of the present invention, the resist composition is dissolved in a solvent, coated on the wafer substrate and then dried to be the resist. Some coating methods may be also used, for instance, a spin coating, casting coating or roll coating.

The resist device coated in any of the above-mentioned methods is partially exposed to radiation. Rays to be radiated are I-ray, KrF excimer laser, ArF excimer laser or electronic ray. However, no limitation should be made to the type of rays. Instead, a ray to be used will be selected depending on a type of an acid-generating agent.

The developing solution can be selected from the aqueous solution of NaOH, KOH, $NaCO_3$, sodium silicate, methae sodium silicate, ammonia, ethyl amine, n-prophyl amine, triethylamine, tetramethylammonium hydroxide or tetraethylammonium hydroxide, preferably tetramethylammonium hydroxide. If necessary, surfactant or aqueous alcohol is further added.

Now, the present invention will be described in further detail by way of the following synthesis, but the scope of the present invention is not limited to the following examples.

SYNTHESIS EXAMPLE 1

Synthesis of the Polymer Represented by Formula 3 (Through Radical Polymerization)

Mmaleic acid of 58 g and norbornene of 47 g are added to a flask, and dioxane of 315 g is also added to the flask to be dissolved. After a reflux with nitrogen, AIBN of 10.5 g is added to the flask and then the internal temperature of the flask is raised to 65° C. Thus, the mixture is kept at the same temperature for 12 hours for reaction, and then precipitated in an excess of 2% HCl aqueous solution. Finally, white precipitate is obtained. The precipitate is filtered, washed and dried at a vacuum oven. The resultant polymer is represented by formula 3.

SYNTHESIS EXAMPLE 2

Synthesis of the Polymer Represented by Formula 3 (Under the Base Catalyst)

A copolymer of maleic acid and norbornene of 50 g is dispersed in water, and then NaOH aqueous solution of 25 g is dropped slowly. Afterwards, it is polymerized at a room temperature for 2 hours, and it is further reacted at 80° C. for 3 hours. After reaction, the temperature is lowered to a room temperature, and then the reaction mixture is added to 5% HCl aqueous solution and stirred for 2 hours. Then, white precipitate is obtained. The precipitate is filtered, washed and dried at a vacuum oven. The resultant polymer is represented by formula 3.

SYNTHESIS EXAMPLE 3

Synthesis of the Polymer Represented by Formula 3 (Under the Acid Catalyst)

A copolymer of maleic anhydride and norbornene of 50 g is dissolved in dioxane of 250 g and the internal temperature of a reactor is raised to 80° C. Sulfuric acid of 1 g is dissolved in water of 28 g in another flask. Then, this solution is poured into the above-mentioned reactor slowly. After stirring for 10 hours at an identical temperature of 80° C., the reaction temperature is lowered to a room temperature. Afterwards, the reaction mixture is poured into 2% hydrochloric acid aqueous solution. At last, white precipitate is obtained and additionally stirred for 1 hour. The white precipitate is filtered, washed and dried at a vacuum oven. The resultant polymer is represented by formula 3.

SYNTHESIS EXAMPLE 4

Synthesis of the Polymer Represented by Formula 4

Dioxane of 414 g is added to a flask with maleic acid of 58 g and dimethanooctahydronaphthalene of 80 g, and then the mixture is dissolved. After purging with nitrogen gas, the internal temperature of a reactor is raised to 65° C. After being stirred for 10 hours at the aforementioned temperature, an excess of the reaction mixture is poured into 2% hydrochloric aqueous solution slowly. Then white precipitate is finally obtained. The precipitate is filtered, washed and dried at a vacuum oven. The resultant polymer is represented by formula 4.

SYNTHESIS EXAMPLE 5

Synthesis of the Polymer Represented by Formula 9

A polymer of 50 g represented by formula 4, which has been obtained according to synthesis example 4, and dioxane of 250 g are dissolved in a pressure reactor. Sulfuric acid of 1 g is added to the above-mentioned solution and then isobutene of 20 g is added to the pressure reactor at −10° C. After being stirred for 30 minutes, the temperature of the reactor is raised to a room temperature and then it is kept identical for 2 hours for reaction. After completion of the reaction, the mixture is poured into an excess of water. Then, white precipitate is obtained. The precipitate is filtered, washed and dried at a vacuum oven. The resultant polymer is represented by formula 9.

SYNTHESIS EXAMPLE 6

Synthesis of the Polymer Represented by Formula 10

Polymer of 50 g represented by formula 3, which has been obtained according to synthesis example 4, is dissolved in dioxane of 250 g, and, then, 2-(chloromethoxy-metyl)-3-methyl-bicyclo[2,2,1] heptane of 22 g is added to it. Triethylamine of 14 g is added to the above-mentioned solution slowly. After being stirred for 3 hours at a room temperature, the reaction mixture is poured into 2% of HCl aqueous solution. Then, white precipitate is obtained. The precipitate is filtered, washed and dried at a vacuum oven. The resultant polymer is represented by formula 10.

SYNTHESIS EXAMPLE 7

Synthesis of the Polymer Represented by Formula 15

Polymer of 65 g represented by formula 4, which has been obtained according to synthesis example 4, is dissolved in dioxane of 330 ml, and then cyclohexyl vinyl ether of 15 g is added with toluenesulfonic acid of 80 mg as a catalyst. After being stirred for 3 hours at a room temperature, the mixture is poured into an excess of the aqueous solution. Then, white precipitate is obtained. The precipitate is filtered, washed and dried at a vacuum oven. The resultant polymer is represented by formula 15.

SYNTHESIS EXAMPLE 8

Synthesis of the Polymer Represented by Formula 18

Dioxane of 820 g is added and dissolved in a flask of 116 g maleic acid, 80 g dimethanooctahydronaphthalene, and 77 g carveol. After purging with nitrogen gas, 27.3 g AIBN is added and the internal temperature of a reactor is raised to 65° C. After being kept at an identical temperature for 2 hours for reaction, the mixture is poured into an excess of 2% HCl aqueous solution. Then, white precipitate is obtained. The precipitate is filtered, washed and dried at a vacuum oven. The resultant polymer is represented by formula 18.

SYNTHESIS EXAMPLE 9

Synthesis of the Polymer Represented by Formula 21

A 64 g polymer represented by formula 18, which has been obtained according to synthesis example 8, is dissolved in 320 g dioxane, and then 22 g 2-(chloromethoxy-methyl)-3-methyl-bicyclo[2,2,1] heptane) is further added. Triethylamine of 14 g is added to the mixture solution slowly. Then, white precipitate is obtained. The precipitate is filtered, washed and dried at a vacuum oven. The resultant polymer is represented by formula 21.

SYNTHESIS EXAMPLE 10

Synthesis of the Polymer Represented by Formula 23

Dioxane of 650 g is added to a flask with 116 g maleic acid, 47 g norbornene and 52 g styrene to be dissolved together. After purging with nitrogen gas, 21.5 g AIBN is added and the internal temperature of a reactor is raised to 65° C. After being reacted for 12 hours at the same temperature, the mixture is poured into an excess of 2% HCl aqueous solution. Then, white precipitate is obtained. The precipitate is filtered, washed and dried at a vacuum oven. The resultant polymer is represented by formula 23.

SYNTHESIS EXAMPLE 11

Synthesis of the Polymer Represented by Formula 26

A 50 g polymer represented by formula 23, which has been obtained according to synthesis example 10, and 250 g dioxane are dissolved in a reactor. A 1 g sulfuric acid is added to the solution and then 26 g isobutene is added at −10° C. After being stirred for 30 minutes, the temperature of the reactor is raised to a room temperature and maintained for 2 hours for reaction. After completion of reaction, the mixture is poured into an excess of water slowly. Then, white precipitate is obtained. The precipitate is filtered, washed and dried at a vacuum oven. The resultant polymer is represented by formula 26.

SYNTHESIS EXAMPLE 12

Synthesis of the Polymer Represented by Formula 27

A 50 g polymer represented by formula 23, which has been obtained according to synthesis example 10, and 250 g dioxane are dissolved, and then 22 g 2-(chloromethoxy-methyl)-3-methyl-bicyclo[2,2,1] heptane) is further added. Triethylamine of 14 g is added to the solution. After being stirred for 3 hours, the mixture is poured to 2% HCl aqueous solution. Then, white precipitate is obtained. The precipitate is filtered, washed and dried at a vacuum oven. The resultant polymer is represented by formula 27.

SYNTHESIS EXAMPLE 13

Synthesis of the Polymer Represented by Formula 30

Maleic acid of 116 g, dimethanooctahydronaphthalene of 80 g and dihydropyran of 42 g are dissolved in a 710 g dioxane. After purging with nitrogen gas, 23.8 g AIBN is added and the temperature of a reactor is increased to 65° C. After reaction for 12 hours, the mixture is added to an excess of 2% HCl aqueous solution. Then, white precipitate is obtained. The precipitate is filtered, washed and dried at a vacuum oven. The resultant polymer is represented by formula 30.

SYNTHESIS EXAMPLE 14

Synthesis of the Polymer Represented by Formula 32

Polymer of 56 g represented by formula 30, which has been obtained according to synthesis example 13 is dissolved in 280 g dioxane, and then 22 g 2-(chloromethoxy-methyl)-3-methyl-bicyclo[2,2,1] heptane) is added. Triethylamine of 14 g is added to the solution. After being stirred for 3 hours, the mixture is poured into 2% HCl aqueous solution. Then, white precipitate is obtained. The precipitate is filtered, washed and dried at a vacuum oven. The resultant polymer is represented by formula 32.

SYNTHESIS EXAMPLE 15

Synthesis of the Polymer Represented by Formula 34

Maleic acid of 70 g, dimethanooctahydronaphthalene of 80 g and dihydroxyethyl methacrylate of 13 g are dissolved in 490 g dioxane. After purging with nitrogen gas, 16.3 g AIBN is added, and the temperature of a reactor is raised to 65° C. After reaction for 12 hours, the mixture is added to an excess of 2% HCl aqueous solution. Then, white precipitate is obtained. The precipitate is filtered, washed and dried at a vacuum oven. The resultant polymer is represented by formula 34.

SYNTHESIS EXAMPLE 16

Synthesis of the Polymer Represented by Formula 36

Polymer of 68 g represented by formula 34, which has been obtained according to synthesis example 15, is dissolved in 340 g dioxane. Then, 22 g 2-(chloromethoxy-methyl)-3-methyl-bicyclo[2,2,1] heptane) is added. 14 g triethylamine is added to the solution. After being stirred for 3 hours, the mixture is added to 2% HCl aqueous solution. Then, white precipitate is obtained. The precipitate is filtered, washed and dried at a vacuum oven. The resultant polymer is represented by formula 36.

SYNTHESIS EXAMPLE 17

Synthesis of the Polymer Represented by Formula 38

Maleic acid of 58 g, dimethanooctahydronaphthalene of 160 g and maleic anhydride of 49 g are dissolved in 800 g dioxane. After purging with nitrogen gas, 26.7 g AIBN is added, and the temperature of a reactor is raised to 65° C. After reaction for 12 hours, the mixture is added to an excess of 2% HCl aqueous solution. Then, white precipitate is obtained. The precipitate is filtered, washed and dried at a vacuum oven. The resultant polymer is represented by formula 38.

SYNTHESIS EXAMPLE 18

Synthesis of the Polymer Represented by Formula 40

Polymer of 67 g represented by formula 38, which has been obtained according to synthesis example 15 are dissolved in 340 g dioxane, and then 22 g 2-(chloromethoxymethyl)-3-methyl-bicyclo[2,2,1] heptane) is added. 14 g triethylamine is added to the solution. After being stirred for 3 hours, the mixed reactants are added to 2% HCl aqueous solution. Then, white precipitate is obtained. The precipitate is filtered, washed and dried at a vacuum oven. The resultant polymer is represented by formula 40.

SYNTHESIS EXAMPLE 19

Synthesis of the Polymer Represented by Formula 42

Maleic acid monomethyl ester of 65 g and dimethanooctahydronaphthalene of 80 g are dissolved in 430 g dioxane. After purging with nitrogen gas, 14.5 g AIBN is added, and the temperature of a reactor is raised to 65° C. After reaction for 12 hours, the mixed reactants are added to an excess of 2% HCl aqueous solution. Then, white precipitate is obtained. The precipitate is filtered, washed and dried at vacuum oven. The resultant polymer is represented by formula 42.

SYNTHESIS EXAMPLE 20

Synthesis of the Polymer Represented by Formula 42 (Alcoholysis)

Copolymer of 50 g, maleic anhydride and dimethannooctahydronaphthalene, is dissolved in 200 g methanol, and the temperature of a reactor is raised to 80° C. 1 g sulfuric acid is dissolved in 50 g methanol in another flask, and then it was poured into a reaction mixture slowly. After being stirred for 10 hours, the temperature is lowered to a room temperature, and then the mixture is added to an excess of 2% HCl aqueous solution. Then, white precipitate is obtained. After being poured, it is stirred for 1 hour. The precipitate is filtered, washed and dried at a vacuum oven. The resultant polymer is represented by formula 42.

SYNTHESIS EXAMPLE 21

Synthesis of the Polymer Represented by Formula 49

Polymer of 69 g represented by formula 42, which has been obtained according to synthesis example 20, is dissolved in 350 g dioxane, and then 22 g 2-(chloromethoxymethyl)-3-methyl-bicyclo[2,2,1] heptane) is added. 14 g triethylamine is added slowly to the solution. After being stirred for 3 hours at a room temperature, the mixture is added to 2% HCl aqueous solution. Then, white precipitate is obtained. The precipitate is filtered, washed and dried at a vacuum oven. The resultant polymer is represented by formula 49.

EXAMPLE 1

1.2 part by weight of triphenylsulfonium triflate as a acid generating agent and triethylamine as a base additive to 100 parts by weight of polymer have been obtained according to synthesis example 5. They are dissolved in 600 parts by weight of propyleneglocol methylether acetate, and then filtered with 0.2 $\mu$m filter.

The resist solution spin is coated on a substrate, and the resist having a surface layer of 0.4 $\mu$m thickness is formed by heating at 110° C. for 90 seconds. The surface layer is exposed to ArF excimer laser and then annealed at 130° C. for 90 seconds. After cooling, a resist pattern is formed by developing in 2.38 wt. % tetraammonium hydroxide aqueous solution, and it is washed and dried. The resultant resist pattern has a good adhesive property, 0.13 $\mu$m resolution, and 16 mJ/cm$^2$ sensitivity.

EXAMPLE 2

The resist preparation is performed as described in Example 1, but the polymer obtained in synthesis example 6 is used instead of the polymer obtained in synthesis example 5. The resultant resist pattern has 0.13 $\mu$m resolution, and 18 mJ/cm$^2$ sensitivity.

EXAMPLE 3

The resist preparation is performed as described in Example 1, but the polymer obtained in synthesis example 7 is used instead of the polymer obtained in synthesis example 5. The resultant resist pattern has 0.16 $\mu$m resolution, and 14 mJ/cm$^2$ sensitivity.

EXAMPLE 4

The resist preparation is performed as described in Example 1, but the polymer obtained in synthesis example 9 is used instead of the polymer obtained in synthesis example 5. The resultant resist pattern has 0.13 $\mu$m resolution, and 20 mJ/cm$^2$ sensitivity.

EXAMPLE 5

The resist preparation is performed as described in Example 1, but the polymer used in synthesis example 11 is used instead of the polymer obtained in synthesis example 5 and a KrF excimer laser is utilized instead of ArF excimer laser. The resultant resist pattern has 0.15 $\mu$m resolution, and 27 mJ/cm$^2$ sensitivity.

EXAMPLE 6

The resist preparation is performed as described in Example 1, but the polymer obtained in synthesis example 12 is used instead of the polymer obtained in synthesis example 5, and a KrF excimer laser is utilized instead of ArF excimer laser. The resultant resist pattern has 0.14 $\mu$m resolution, and 30 mJ/cm$^2$ sensitivity.

EXAMPLE 7

The resist preparation was performed as described in Example 1, but the polymer obtained in synthesis example 14 is used instead of the polymer obtained in synthesis example 5. The resultant resist pattern has 0.14 $\mu$m resolution, and 17 mJ/cm$^2$ sensitivity.

EXAMPLE 8

The resist preparation was performed as described in Example 1, but the polymer obtained in synthesis example 16 is used instead of the polymer obtained in synthesis example 5. The resultant resist pattern has 0.12 μm resolution, and 13 mJ/cm² sensitivity.

EXAMPLE 9

The resist preparation is performed as described in Example 1, but the polymer obtained in synthesis example 18 is used instead of the polymer obtained in synthesis example 5. The resultant resist pattern has 0.17 μm resolution, and 18 mJ/cm² sensitivity.

EXAMPLE 10

The resist preparation is performed as described in Example 1, but the polymer obtained in synthesis example 21 instead of the polymer obtained in synthesis example 5. The resultant resist pattern has 0.13 μm resolution, and 15 mJ/cm² sensitivity.

EXAMPLE 11

The resist preparation is performed as described in Example 1, but 2.0 parts by weight of 4-tert-butoxycarbonylmethoxyphenyl(diphenyl)sulfonium trifulate is used instead of 1.2 parts by weight of the triphenylsulfonium trifulate. The resultant resist pattern has 0.12 μm resolution, and 19 mJ/cm² sensitivity.

EXAMPLE 12

The resist preparation is performed as described in Example 1, but 2.2 parts by weight of 4-tert-butoxycarbonylmethoxyphenyl(diphenyl)sulfonium trifulate is used instead of 1.2 parts by weight of the triphenylsulfonium trifulate. The resultant resist pattern has 0.12 μm resolution, and 21 mJ/cm² sensitivity.

EXAMPLE 13

The resist preparation is performed as described in Example 1, but 1.9 parts by weight of 4-thiophenoxyphenyl (diphenyl)sulfonium trifulate is used instead of 1.2 parts by weight of the triphenylsulfonium trifulate. The resultant resist pattern has 0.13 μm resolution, and 17 mJ/cm² sensitivity.

EXAMPLE 14

The resist preparation is performed as described in Example 1, but 1.6 parts by weight of 4-methoxyphenyl (diphenyl)sulfonium trifulate is used instead of 1.2 parts by weight of the triphenylsulfonium trifulate. The resultant resist pattern has 0.14 μm resolution, and 21 mJ/cm² sensitivity.

EXAMPLE 15

The resist preparation is performed as described in Example 1, but 1.6 parts by weight of 4-chlorophenyl (diphenyl)sulfonium trifulate is used instead of 1.2 parts by weight of the triphenylsulfonium trifulate. The resultant resist pattern has 0.17 μm resolution, and 22 mJ/cm² sensitivity.

EXAMPLE 16

The resist preparation is performed as described in Example 1, but 1.5 parts by weight of 4-flourophenyl (diphenyl)sulfonium trifulate is used instead of 1.2 parts by weight of the triphenylsulfonium trifulate. The resultant resist pattern has 0.12 μm resolution, and 16 mJ/cm² sensitivity.

As described above, the polymer having olefin monomer, maleic acid or fumaric acid derivatives containing cycloolefin within main chain or allicyclic functional group within side chain as a repeating unit is used in preparation for micro-processable resist with far infrared radiation such as KrF or ArF excimer laser, X-ray such as synchrotron radiation, and charged particle radiation such as electron-beam. A chemically amplified resist containing therein has good adhesive property, storage stability, dry etching resistance, and thermal stability and it has a good pattern profile regardless of a substrate type.

What is claimed is:

1. An acid-labile polymer represented by following formula 1:

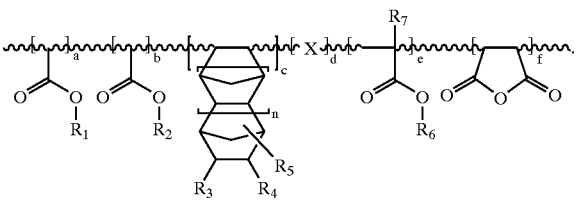

where $R_1$, $R_2$ and $R_6$ are independent of each other and respectively include a hydrogen atom or an alkyl, alkoxymethylene, alkoxyethylene, phenyl, alkoxyalkylene, alkylphenyl, alkoxyphenyl, allyl, benzyl, alkylbenzyl, alkoxybenzyl containing 1 to 34 carbon atoms having or not having an hydroxy, ether, ester, carbonyl, acetal, epoxy, nitrile or aldehyde;

$R_2$ is alkoxyalkylene group represented by following formula 2:

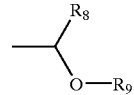

Formula 2 wherein $R_8$ is Hydrogen atom or alkyl group containing $C_1$ to $C_{33}$ having linear, branched and cyclic group, and $R_9$ is alkyl group containing $C_1$ to $C_{33}$ having linear, branched and cyclic group;

$R_5$ is a hydrogen atom, an alkyl or alkoxy group containing 1 to 18 carbon atoms;

$R_7$ is a hydrogen atom, an alkyl group containing 1 to 18 carbon atoms, an alkyl group containing alkoxy 1 to 18 carbon atoms or an alkyl group containing ester of 1 to 18 carbon atoms;

$R_3$ and $R_4$ are independent and include a hydrogen atom, hydroxy, nitrile, aldehyde, hydroxymethylene, and alkylcarbonyloxy, alkyl, hydroxyalkylene, alkoxycarbonyl, alkoxymethylene or alkoxyalkanyl group containing 1 to 18 carbon atoms;

X is olefin derivatives, vinyl ether derivatives or styrene derivatives containing 1 to 40 carbon atoms, alternatively these derivatives may be comprised of hydroxy, ester, alkoxyalkyloxycarbonyl, ketone or ether;

a, b, c, d, e and f are each a number representing a repeating unit in the main chain, wherein a+b+c+d+e+f=1, the content of a and b is 0.1 to 0.7, respectively, (a+b)/(a+b+c+d+e+f)≧0.3, the content of c is 0.1 to 0.9, and the content of d, e and f is 0 to 0.9, respectively; and n is an integer of 0 or 1.

2. The acid-labile polymer, as defined in claim 1, wherein a and b in the repeating unit of the polymer represented by formula 1 are neighbored on each other, and the sum of a and b is more than 30% of a total monomer content.

3. The acid-labile polymer, as defined in claim 1, wherein the content of alicyclic group has more than 5% in the linearity of a side chain.

4. The acid-labile polymer, as defined in claim 1, wherein a and b in the repeating unit of the monomer are derived from polymerization with maleic acid, maleic acid derivatives, fumaric acid or fumaric acid derivatives.

5. The acid-labile polymer, as defined in claim 1, wherein a and b in the repeating unit of the monomer are derived from hydrolysis or alcoholysis of polymer containing maleic anhydride.

6. The acid-labile polymer, as defined in claim 5, wherein the polymer containing maleic anhydride contains at least one selected from the group consisting of hydrogen, alkyl, alkoxymethylene, alkoxyethylene, phenyl, alkoxyalkylene, alkylphenyl, alkoxyphenyl, allyl, benzyl, alkylbenzyl or alkoxybenzyl.

7. A chemically amplified resist composition that consists of 100 parts by weight of at least one polymer selected from the groups represented by the following formula, acid generating agent, additive and solvent,

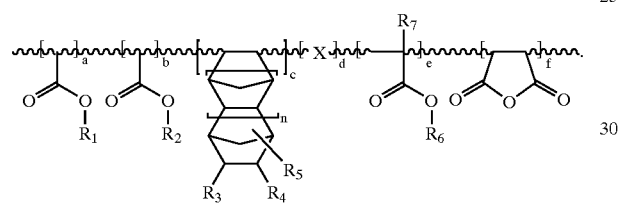

where $R_1$, $R_2$ and $R_6$ are independent of each other and respectively include a hydrogen atom or an alkyl, alkoxymethylene, alkoxyethylene, phenyl, alkoxyalkylene, alkylphenyl, alkoxyphenyl, allyl, benzyl, alkylbenzyl, alkoxybenzyl containing 1 to 34 carbon atoms having or not having an hydroxy, ether, ester, carbonyl, acetal, epoxy, nitrile or aldehyde;

R5 is a hydrogen atom, an alkyl or alkoxy group containing 1 to 18 carbon atoms;

R7 is a hydrogen atom, an alkyl group containing 1 to 18 carbon atoms, an alkyl group containing alkoxy 1 to 18 carbon atoms or an alkyl group containing ester of 1 to 18 carbon atoms;

R3 and R4 are independent and include a hydrogen atom, hydroxy, nitrile, aldehyde, hydroxymethylene, and alkylcarbonyloxy, alkyl, hydroxyalkylene, alkoxycarbonyl, alkoxymethylene or alkoxyalkanyl group containing 1 to 18 carbon atoms;

X is olefin derivatives, vinyl ether derivatives or styrene derivatives containing 1 to 40 carbon atoms, alternatively these derivatives may be comprised of hydroxy, ester, alkoxyalkyloxycarbonyl, ketone or ether;

a, b, c, d, e and f are each a number representing a repeating unit in the main chain, wherein a+b+c+d+e+f=1, the content of a and b is 0 to 0.7, respectively, (a+b)/(a+b+c+d+e+f)≧0.3, and the content of c, d, e and f is 0 to 0.9, respectively; and n is an integer of 0 or 1;

wherein the acid generating agent is at least one selected from the group consisting of the following formulas A and B:

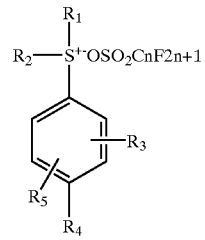

Formula A and

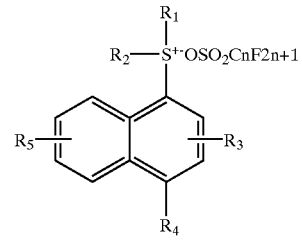

Formula B where $R_1$ and $R_2$ are respectively alkyl, allyl, perfluoro alkyl, benzyl, aryl or halogen compound substituted aryl group;

$R_3$, $R_4$ and $R_5$ are respectively hydrogen atom, alkyl group, halogen group, alkoxy group, aryl group, thiophenoxy group, thioalkoxy group or alkoxycarbonylmethoxy group; and n is an integer 1 to 8.

8. A chemically amplified resist composition, as defined in claim 7, wherein the acid generating agent is at least one selected from the group consisting of the following formulas:

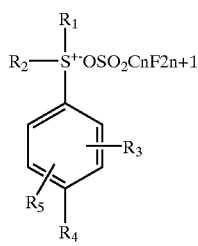 and 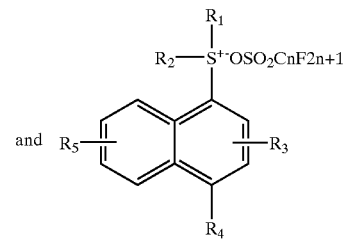

where $R_1$ and $R_2$ are respectively alkyl, allyl, perfluoro alkyl, benzyl, aryl or halogen compound substituted aryl group;

$R_3$, $R_4$ and $R_5$ are respectively hydrogen atom, alkyl group, halogen group, alkoxy group, aryl group, thiophenoxy group, thioalkoxy group or alkoxycarbonylmethoxy group; and n is an integer 1 to 8.

9. The chemically amplified resist composition, as defined in claim 7, where the acid generating agent is 0.3 to 10 parts by weights to the 100 parts by weight of polymer.

* * * * *